(12) United States Patent
Rahardjo et al.

(10) Patent No.: US 10,853,547 B2
(45) Date of Patent: Dec. 1, 2020

(54) SYSTEM AND METHOD TO IDENTIFY CRITICAL FPGA CARD SENSORS

(71) Applicant: Dell Products, L.P., Round Rock, TX (US)

(72) Inventors: Johan Rahardjo, Austin, TX (US); Pavan Kumar Gavvala, Anantapur (IN)

(73) Assignee: Dell Products, L.P., Round Rock, TX (US)

( * ) Notice: Subject to any disclaimer, the term of this patent is extended or adjusted under 35 U.S.C. 154(b) by 102 days.

(21) Appl. No.: 16/171,798

(22) Filed: Oct. 26, 2018

(65) Prior Publication Data

US 2020/0134118 A1     Apr. 30, 2020

(51) Int. Cl.
*G06F 1/20*      (2006.01)
*G06F 30/34*     (2020.01)
*G01K 7/02*      (2006.01)

(52) U.S. Cl.
CPC ............ *G06F 30/34* (2020.01); *G01K 7/021* (2013.01); *G06F 1/206* (2013.01)

(58) Field of Classification Search
CPC .......... G06F 30/34; G06F 1/206; G01K 7/021
See application file for complete search history.

(56) References Cited

U.S. PATENT DOCUMENTS

| | | | | |
|---|---|---|---|---|
| 5,870,267 A | * | 2/1999 | Kitano | G06F 1/206 361/103 |
| 7,370,242 B2 | * | 5/2008 | Chen | G06F 1/20 700/300 |
| 2008/0281475 A1 | * | 11/2008 | Hirai | G05D 23/1931 700/300 |
| 2009/0183519 A1 | * | 7/2009 | Nishikawa | F25B 49/005 62/132 |
| 2014/0006818 A1 | * | 1/2014 | Doshi | G06F 1/3203 713/320 |
| 2015/0032875 A1 | * | 1/2015 | Chu | H04L 43/103 709/224 |
| 2019/0361508 A1 | * | 11/2019 | Yarragunta | F04D 25/166 |

\* cited by examiner

*Primary Examiner* — Thomas C Lee
*Assistant Examiner* — Gary Collins
(74) *Attorney, Agent, or Firm* — Fogarty LLP (57) ABSTRACT

Embodiments are described for identifying critical sensors of a device, such as a FPGA (Field Programmable Gate Array) card, installed within an IHS (Information Handling System). A remote access controller identifies temperature sensors provided by the device and determine alert level thresholds for each of the sensors. The temperature sensors are ranked based on the respective ranges of the alert level thresholds. A first portion of the temperature sensors with the smallest ranges of alert level thresholds are assigned to a first ranked list. Readings from the temperature sensors are monitored and temperature sensors indicating temperature sensor readings rising faster than a first threshold are assigned to a second ranked list. A portion of the temperature sensors in the first ranked list and a portion of the temperature sensors in the second ranked list are designated for use by an airflow cooling system of the IHS.

17 Claims, 3 Drawing Sheets

SYSTEM AND METHOD TO IDENTIFY CRITICAL FPGA CARD SENSORS

FIELD

The present disclosure generally relates to Information Handling Systems (IHSs), and, more particularly, to airflow cooling of IHSs.

BACKGROUND

As the value and use of information continues to increase, individuals and businesses seek additional ways to process and store information. One option available to users is Information Handling Systems (IHSs). An IHS generally processes, compiles, stores, and/or communicates information or data for business, personal, or other purposes thereby allowing users to take advantage of the value of the information. Because technology and information handling needs and requirements vary between different users or applications, IHSs may also vary regarding what information is handled, how the information is handled, how much information is processed, stored, or communicated, and how quickly and efficiently the information may be processed, stored, or communicated. The variations in IHSs allow for IHSs to be general or configured for a specific user or specific use such as financial transaction processing, airline reservations, enterprise data storage, or global communications. In addition, IHSs may include a variety of hardware and software components that may be configured to process, store, and communicate information and may include one or more computer systems, data storage systems, and networking systems.

Historically, the most common technique for customizing the operations of an IHS has been through software programs that are executed by the IHS. More recently, FPGA (Field Programmable Gate Array) cards are used to provide customized IHS functionality at hardware speeds, while doing so at an affordable price. In certain instances, FPGA cards may include numerous temperature sensors that provide temperature readings at various locations on the FPGA card. In some scenarios, the amount of data generated by the temperature sensors precludes timely processing of the data such that the airflow cooling system of the IHS must resort to open-loop airflow cooling.

Components of an IHS generate significant amounts of heat. Heat within an IHS may degrade the reliability and performance of IHS components, possibly resulting in costly malfunctions and component failures. In order to dissipate generated heat, an IHS may include a cooling fan, or a plurality of cooling fans organized within an airflow cooling system. Various components within the IHS may be outfitted with sensors that monitor operating temperatures at various locations in the system. Based on temperature readings provided by such sensors and communicated via buses, corresponding cooling fan adjustments can be made.

An IHS airflow cooling system may utilize open-loop control or closed-loop control in order to determine fan speed settings for the one or more cooling fans that are available to the cooling system of the IHS. Closed-loop control systems typically utilize collected temperature information, such as collected by sensors within the IHS, to determine cooling fan settings. Open-loop control systems, on the other hand, do not utilize collected temperature data and instead rely on preset fan speed configurations, such as a thermal table. In certain scenarios, closed-loop systems may revert to less efficient open-loop cooling when temperature data from sensors is unavailable. However, in scenarios where sensor data is unavailable due to failures in the bus used to communicate with the sensors, fail-over operations by cooling systems may require setting the cooling fans to a safe, but unnecessarily high, fan speed setting, and in some cases to a maximum fan speed setting.

SUMMARY

In various embodiments, a method identifies critical sensors of a device installed within an IHS (Information Handling System). The method includes: identifying a plurality of temperature sensors provided by the device; determining alert level thresholds for each of the plurality of temperature sensors; ranking the temperature sensors based on ranges of the alert level thresholds of the respective temperature sensors; assigning a first portion of the temperature sensors with the smallest ranges of alert level thresholds to a first ranked list; monitoring temperature sensor readings generated by each of the plurality of temperature sensors; assigning temperature sensors indicating temperature sensor readings rising faster than a first threshold to a second ranked list; and designating a portion of the temperature sensors in the first ranked list and a portion of the temperature sensors in the second ranked list for use by the airflow cooling system of the IHS.

In additional method embodiments, the airflow cooling system utilizes the designated temperature sensors to provide closed-loop airflow cooling of the IHS. In additional method embodiments, the alert level thresholds specify temperature thresholds for alert levels comprising a warning level, a critical level and a failure level. In additional method embodiments, the range of the alert level thresholds of a temperature sensor comprises the difference between the warning level temperature threshold and the failure level temperature threshold. In additional method embodiments, the temperature sensor readings of the plurality of temperature sensors are monitored by a management controller of the device. In additional method embodiments, the management controller transmits temperature readings to the remote management controller only for the sensors designated for use by the airflow cooling system. In additional method embodiments, the device is an FPGA (Field Programmable Gate Array) card.

In various embodiments, a system identifies critical sensors of device installed within an IHS (Information Handling System). The system includes: a remote access controller configured to monitor operations of the IHS, the remote access controller configured to: identify a plurality of temperature sensors provided by the device; determine alert level thresholds for each of the plurality of temperature sensors; rank the temperature sensors based on the ranges of the alert level thresholds of the respective temperature sensors; assign a first portion of the temperature sensors with the smallest ranges of alert level thresholds to a first ranked list; monitor temperature sensor readings generated by each of the plurality of temperature sensors; assign temperature sensors indicating temperature sensor readings rising faster than a first threshold to a second ranked list; and designate a portion of the temperature sensors in the first ranked list and a portion of the temperature sensors in the second ranked list for use by the airflow cooling system of the IHS; and a management controller of the device configured to: forward temperature readings generated by the designated portion of temperature sensors to the remote access controller.

In additional system embodiments, the airflow cooling system utilizes the designated temperature sensors to provide closed-loop airflow cooling of the IHS. In additional system embodiments, the alert level thresholds specify temperature thresholds for alert levels comprising a warning level, a critical level and a failure level. In additional system embodiments, the range of the alert level thresholds of a temperature sensor comprises the difference between the warning level temperature threshold and the failure level temperature threshold. In additional system embodiments, the temperature sensor readings of the plurality of temperature sensors are monitored by the management controller and only the readings for the designated portion of the temperature sensors are transmitted to the remote access controller. In additional system embodiments, the device is an FPGA (Field Programmable Gate Array) card.

In various embodiments, a remote access controller identifies critical sensors of a device installed within an IHS (Information Handling System), the remote access controller configured to: identify a plurality of temperature sensors provided by the device; determine alert level thresholds for each of the plurality of temperature sensors; rank the temperature sensors based on the ranges of the alert level thresholds of the respective temperature sensors; assign a first portion of the temperature sensors with the smallest ranges of alert level thresholds to a first ranked list; monitor temperature sensor readings generated by each of the plurality of temperature sensors; assign temperature sensors indicating temperature sensor readings rising faster than a first threshold to a second ranked list; and designate a portion of the temperature sensors in the first ranked list and a portion of the temperature sensors in the second ranked list for use by the airflow cooling system of the IHS.

In additional remote access controller embodiments, the airflow cooling system utilizes the designated temperature sensors to provide closed-loop airflow cooling of the IHS. In additional remote access controller embodiments, the alert level thresholds specify temperature thresholds for alert levels comprising a warning level, a critical level and a failure level. In additional remote access controller embodiments, the range of the alert level thresholds of a temperature sensor comprises the difference between the temperature warning level temperature threshold and the failure level temperature threshold. In additional remote access controller embodiments, the temperature sensor readings of the plurality of temperature sensors are monitored by a management controller of the device. In additional remote access controller embodiments, the management controller transmits temperature readings to the remote management controller only for the sensors designated for use by the airflow cooling system. In additional remote access controller embodiments, the device is an FPGA (Field Programmable Gate Array) card.

BRIEF DESCRIPTION OF THE DRAWINGS

The present invention(s) is/are illustrated by way of example and is/are not limited by the accompanying figures. Elements in the figures are illustrated for simplicity and clarity, and have not necessarily been drawn to scale.

DETAILED DESCRIPTION

Figure 1:
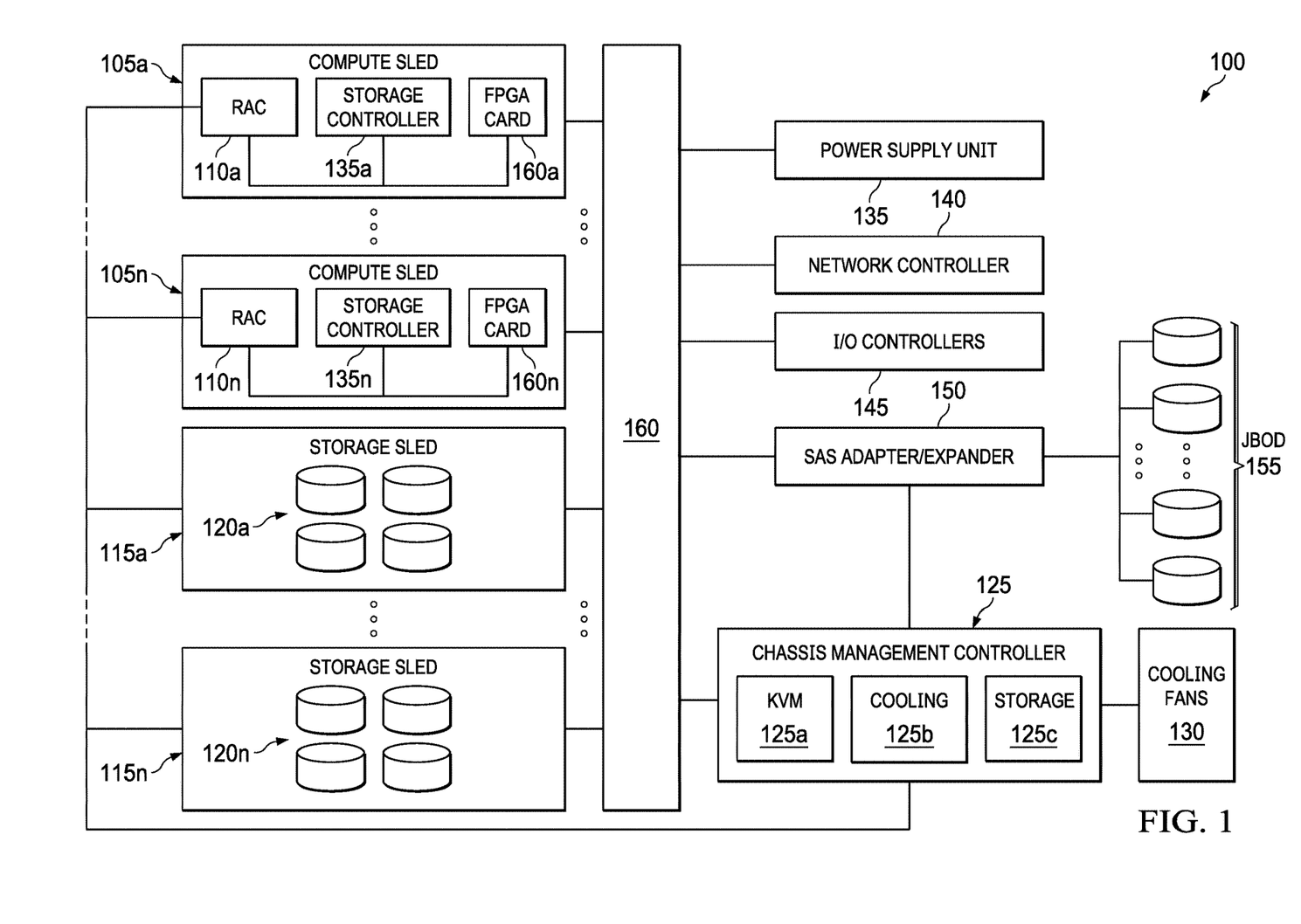
FIG. 1 is a diagram illustrating certain components of a chassis, according to some embodiments, for identifying critical sensors of an FPGA installed within an IHS.

FIG. 1 is a block diagram illustrating certain components of a chassis 100 comprising one or more compute sleds 105a-n and one or more storage sleds 115a-n that may be configured to implement the systems and methods described herein. Chassis 100 may include one or more bays that each receive an individual sled (that may be additionally or alternatively referred to as a tray, blade, and/or node), such as compute sleds 105a-n and storage sleds 115a-n. Chassis 100 may support a variety of different numbers (e.g., 4, 8, 16, 32), sizes (e.g., single-width, double-width) and physical configurations of bays. Other embodiments may include additional types of sleds that provide various types of storage and/or processing capabilities. Other types of sleds may provide power management and networking functions. Sleds may be individually installed and removed from the chassis 100, thus allowing the computing and storage capabilities of a chassis to be reconfigured by swapping the sleds with different types of sleds, in many cases without affecting the operations of the other sleds installed in the chassis 100.

Multiple chassis 100 may be housed within a rack. Data centers may utilize large numbers of racks, with various different types of chassis installed in the various configurations of racks. The modular architecture provided by the sleds, chassis and rack allow for certain resources, such as cooling, power and network bandwidth, to be shared by the compute sleds 105a-n and storage sleds 115a-n, thus providing efficiency improvements and supporting greater computational loads.

Chassis 100 may be installed within a rack structure that provides all or part of the cooling utilized by chassis 100. For airflow cooling, a rack may include one or more banks of cooling fans that may be operated to ventilate heated air from within the chassis 100 that is housed within the rack. The chassis 100 may alternatively or additionally include one or more cooling fans 130 that may be similarly operated to ventilate heated air from within the sleds 105a-n, 115a-n installed within the chassis. A rack and a chassis 100 installed within the rack may utilize various configurations and combinations of cooling fans to cool the sleds 105a-n, 115a-n and other components housed within chassis 100.

The sleds 105a-n, 115a-n may be individually coupled to chassis 100 via connectors that correspond to the bays provided by the chassis 100 and that physically and electrically couple an individual sled to a backplane 160. Chassis backplane 160 may be a printed circuit board that includes electrical traces and connectors that are configured to route signals between the various components of chassis 100 that are connected to the backplane 160. In various embodiments, backplane 160 may include various additional components, such as cables, wires, midplanes, backplanes, connectors, expansion slots, and multiplexers. In certain embodiments, backplane 160 may be a motherboard that includes various electronic components installed thereon. Such components installed on a motherboard backplane 160 may include components that implement all or part of the functions described with regard to the SAS (Serial Attached SCSI) expander 150, I/O controllers 145, network controller 140 and power supply unit 135.

Figure 2:
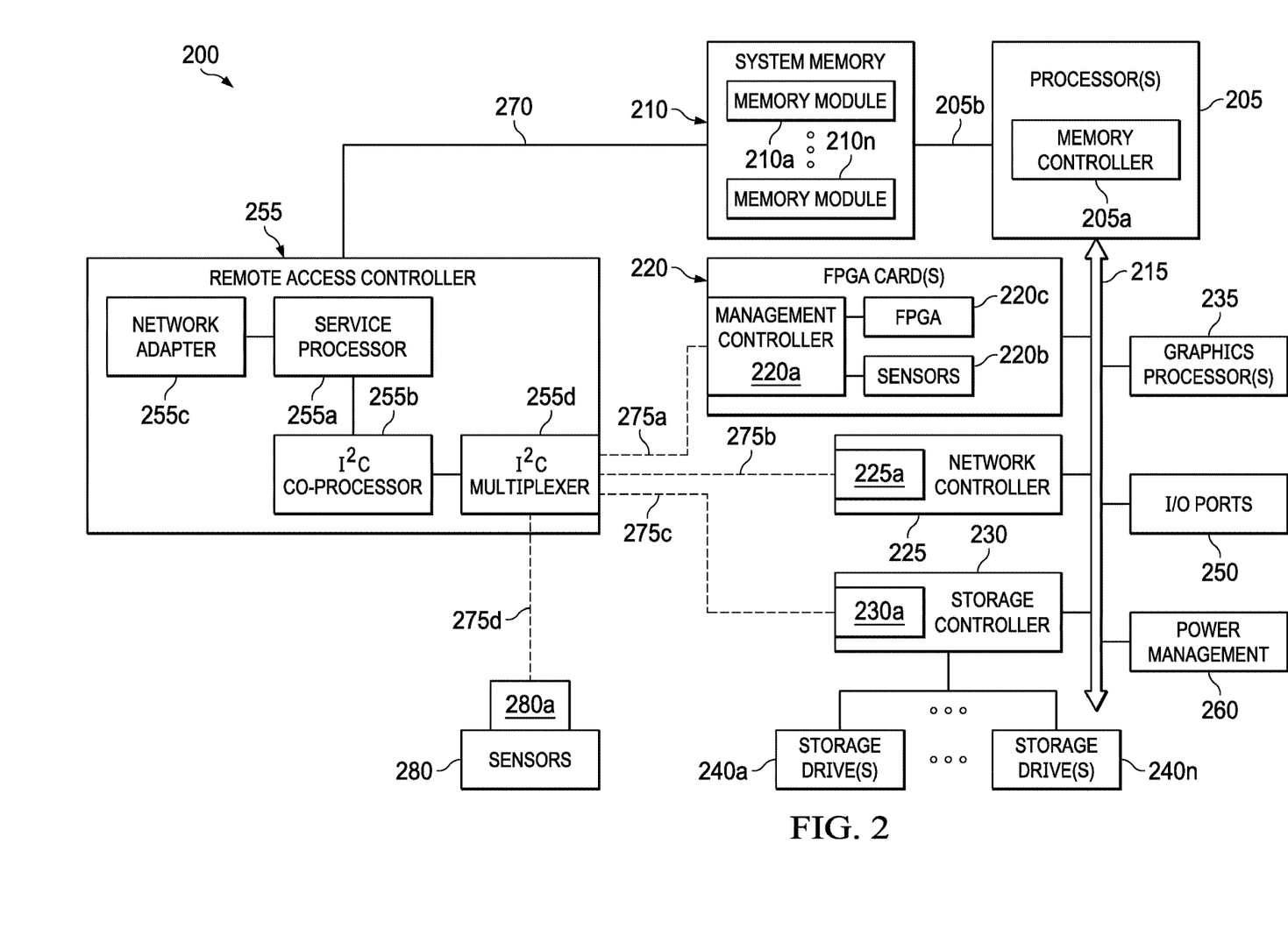
FIG. 2 is a diagram illustrating certain components of an IHS configured as a component of chassis, according to some embodiments, for identifying critical sensors of an FPGA installed within an IHS.

In certain embodiments, a compute sled 105a-n may be an IHS such as described with regard to IHS 200 of FIG. 2. A compute sled 105a-n may provide computational processing resources that may be used to support a variety of e-commerce, multimedia, business and scientific computing applications, such as services provided via a cloud implementation. Compute sleds 105a-n are typically configured with hardware and software that provide leading-edge computational capabilities. Accordingly, services provided using such computing capabilities are typically provided as high-availability systems that operate with minimum downtime. As described in additional detail with regard to FIG. 2, compute sleds 105a-n may be configured for general-purpose computing or may be optimized for specific computing tasks.

As illustrated, each compute sled 105a-n includes a remote access controller (RAC) 110a-n. As described in additional detail with regard to FIG. 2, remote access controller 110a-n provides capabilities for remote monitoring and management of compute sled 105a-n. In support of these monitoring and management functions, remote access controllers 110a-n may utilize both in-band and sideband (i.e., out-of-band) communications with various components of a compute sled 105a-n and chassis 100. Remote access controller 110a-n may collect sensor data, such as temperature sensor readings, from components of the chassis 100 in support of airflow cooling of the chassis 100 and the sleds 105a-n, 115a-n. In addition, each remote access controller 110a-n may implement various monitoring and administrative functions related to compute sleds 105a-n that require sideband bus connections with various internal components of the respective compute sleds 105a-n.

As illustrated, chassis 100 also includes one or more storage sleds 115a-n that are coupled to the backplane 160 and installed within one or more bays of chassis 200 in a similar manner to compute sleds 105a-n. Each of the individual storage sleds 115a-n may include various different numbers and types of storage devices. For instance, storage sleds 115a-n may include SAS (Serial Attached SCSI) magnetic disk drives, SATA (Serial Advanced Technology Attachment) magnetic disk drives, solid-state drives (SSDs) and other types of storage drives in various combinations. The storage sleds 115a-n may be utilized in various storage configurations by the compute sleds 105a-n that are coupled to chassis 100.

Each of the compute sleds 105a-n includes a storage controller 135a-n that may be utilized to access storage drives that are accessible via chassis 100. Some of the individual storage controllers 135a-n may provide support for RAID (Redundant Array of Independent Disks) configurations of logical and physical storage drives, such as storage drives provided by storage sleds 115a-n. In some embodiments, some or all of the individual storage controllers 135a-n may be HBAs (Host Bus Adapters) that provide more limited capabilities in accessing physical storage drives provided via storage sleds 115a-n and/or via SAS expander 150.

As illustrated, each of the compute sleds 105a-n also includes an FPGA card 160a-n that may be configured to customize the operations of compute sled 105a-n. As described in additional detail with regard to FIGS. 2 and 3, FPGA cards 160a-n may include numerous sensors. In some scenarios, the amount of sensor data generated by the sensors precludes timely processing of the collected sensor readings. In various embodiments, remote access controllers 110a-n may be configured to identify critical temperature sensors of an FPGA card 160a-n installed within an IHS, such as compute sleds 105a-n. As described in additional detail below, a remote access controller may rely exclusively on the readings of FPGA temperature sensors that have been identified as being critical to maintaining FPGA temperatures below thresholds that may trigger open-loop cooling operations.

In addition to the data storage capabilities provided by storage sleds 115a-n, chassis 100 may provide access to other storage resources that may be installed components of chassis 100 and/or may be installed elsewhere within a rack housing the chassis 100, such as within a storage blade. In certain scenarios, such storage resources 155 may be accessed via a SAS expander 150 that is coupled to the backplane 160 of the chassis 100. The SAS expander 150 may support connections to a number of JBOD (Just a Bunch Of Disks) storage drives 155 that may be configured and managed individually and without implementing data redundancy across the various drives 155. The additional storage resources 155 may also be at various other locations within a datacenter in which chassis 100 is installed. Such additional storage resources 155 may also may be remotely located.

As illustrated, the chassis 100 of FIG. 1 includes a network controller 140 that provides network access to the sleds 105a-n, 115a-n installed within the chassis. Network controller 140 may include various switches, adapters, controllers and couplings used to connect chassis 100 to a network, either directly or via additional networking components and connections provided via a rack in which chassis 100 is installed. Chassis 100 may similarly include a power supply unit 135 that provides the components of the chassis with various levels of DC power from an AC power source or from power delivered via a power system provided by a rack within which chassis 100 may be installed. In certain embodiments, power supply unit 135 may be implemented within a sled that may provide chassis 100 with redundant, hot-swappable power supply units.

Chassis 100 may also include various I/O controllers 140 that may support various I/O ports, such as USB ports that may be used to support keyboard and mouse inputs and/or video display capabilities. Such I/O controllers 145 may be utilized by the chassis management controller 125 to support various KVM (Keyboard, Video and Mouse) 125a capabilities that provide administrators with the ability to interface with the chassis 100. The chassis management controller 125 may also include a storage module 125c that provides capabilities for managing and configuring certain aspects of the storage devices of chassis 100, such as the storage devices provided within storage sleds 115a-n and within the JBOD 155.

In addition to providing support for KVM 125a capabilities for administering chassis 100, chassis management controller 125 may support various additional functions for sharing the infrastructure resources of chassis 100. In some scenarios, chassis management controller 125 may implement tools for managing the power 135, network bandwidth 140 and airflow cooling 130 that are available via the chassis 100. As described, the airflow cooling 130 utilized by chassis 100 may include an airflow cooling system that is provided by a rack in which the chassis 100 may be installed and managed by a cooling module 125b of the chassis management controller 125.

For purposes of this disclosure, an IHS may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an IHS may be a personal computer (e.g., desktop or laptop), tablet computer, mobile device (e.g., Personal Digital Assistant (PDA) or smart phone), server (e.g., blade server or rack server), a network storage device, or any other suitable device and may vary in size, shape, performance, functionality, and price. An IHS may include Random Access Memory (RAM), one or more processing resources such as a Central Processing Unit (CPU) or hardware or software control logic, Read-Only Memory (ROM), and/or other types of nonvolatile memory. Additional components of an IHS may include one or more disk drives, one or more network ports for communicating with external devices as well as various I/O devices, such as a keyboard, a mouse, touchscreen, and/or a video display. As described, an IHS may also include one or more buses operable to transmit communications between the various hardware components. An example of an IHS is described in more detail below.

FIG. 2 shows an example of an IHS 200 configured to implement systems and methods described herein. It should be appreciated that although the embodiments described herein may describe an IHS that is a compute sled or similar computing component that may be deployed within the bays of a chassis, other embodiments may be utilized with other types of IHSs. In the illustrative embodiment of FIG. 2, IHS 200 may be a computing component, such as compute sled 105a-n, that is configured to share infrastructure resources provided by a chassis 100.

The IHS 200 of FIG. 2 may be a compute sled, such as compute sleds 105a-n of FIG. 1, that may be installed within a chassis, that may in turn be installed within a rack. Installed in this manner, IHS 200 may utilized shared power, network and cooling resources provided by the chassis and/or rack. IHS 200 may utilize one or more processors 205. In some embodiments, processors 205 may include a main processor and a co-processor, each of which may include a plurality of processing cores that, in certain scenarios, may each be used to run an instance of a server process. In certain embodiments, one or all of processor(s) 205 may be graphics processing units (GPUs) in scenarios where IHS 200 has been configured to support functions such as multimedia services and graphics applications.

As illustrated, processor(s) 205 includes an integrated memory controller 205a that may be implemented directly within the circuitry of the processor 205, or the memory controller 205a may be a separate integrated circuit that is located on the same die as the processor 205. The memory controller 205a may be configured to manage the transfer of data to and from the system memory 210 of the IHS 205 via a high-speed memory interface 205b.

The system memory 210 is coupled to processor(s) 205 via a memory bus 205b that provides the processor(s) 205 with high-speed memory used in the execution of computer program instructions by the processor(s) 205. Accordingly, system memory 210 may include memory components, such as such as static RAM (SRAM), dynamic RAM (DRAM), NAND Flash memory, suitable for supporting high-speed memory operations by the processor(s) 205. In certain embodiments, system memory 210 may combine both persistent, non-volatile memory and volatile memory.

In certain embodiments, the system memory 210 may be comprised of multiple removable memory modules. The system memory 210 of the illustrated embodiment includes removable memory modules 210a-n. Each of the removable memory modules 210a-n may correspond to a printed circuit board memory socket that receives a removable memory module 210a-n, such as a DIMM (Dual In-line Memory Module), that can be coupled to the socket and then decoupled from the socket as needed, such as to upgrade memory capabilities or to replace faulty components. Other embodiments of IHS system memory 210 may be configured with memory socket interfaces that correspond to different types of removable memory module form factors, such as a Dual In-line Package (DIP) memory, a Single In-line Pin Package (SIPP) memory, a Single In-line Memory Module (SIMM), and/or a Ball Grid Array (BGA) memory.

IHS 200 may utilize a chipset that may be implemented by integrated circuits that are connected to each processor 205. All or portions of the chipset may be implemented directly within the integrated circuitry of an individual processor 205. The chipset may provide the processor(s) 205 with access to a variety of resources accessible via one or more buses 215. Various embodiments may utilize any number of buses to provide the illustrated pathways served by bus 215. In certain embodiments, bus 215 may include a PCIe (PCI Express) switch fabric that is accessed via a PCIe root complex. IHS 200 may also include one or more I/O ports 250, such as PCIe ports, that may be used to couple the IHS 200 directly to other IHSs, storage resources or other peripheral components.

As illustrated, a variety of resources may be coupled to the processor(s) 205 of the IHS 200 via bus 215. For instance, processor(s) 205 may be coupled to a network controller 225, such as provided by a Network Interface Controller (NIC) that is coupled to the IHS 200 and allows the IHS 200 to communicate via an external network, such as the Internet or a LAN. Processor(s) 205 may also be coupled to a power management unit 260 that may interface with the power system unit 135 of the chassis 100 in which an IHS, such as a compute sled, may be installed. In certain embodiments, a graphics processor 235 may be comprised within one or more video or graphics cards, or an embedded controller, installed as components of the IHS 200. In certain embodiments, graphics processor 235 may be an integrated of the remote access controller 255 and may be utilized to support the display of diagnostic and administrative interfaces related to IHS 200 via display devices that are coupled, either directly or remotely, to remote access controller 255.

As illustrated, IHS 200 may include one or more FPGA (Field-Programmable Gate Array) card(s) 220. Each of the FPGA card 220 supported by IHS 200 may include various processing and memory resources, in addition to an FPGA integrated circuit that may be reconfigured after deployment of IHS 200 through programming functions supported by the FPGA card 220. Each individual FGPA card 220 may be optimized to perform specific processing tasks, such as specific signal processing, security, data mining, and artificial intelligence functions, and/or to support specific hardware coupled to IHS 200.

As illustrated, an FPGA card 220 may include an FPGA integrated circuit 220c that may be reprogrammed in order to modify the internal circuitry of the FPGA 220c, thus modifying the operations performed by the FPGA card 220. As described, an FPGA card 220 may include various numbers of sensors 220b. As specialized computing components, FPGA cards are frequently support large-scale computational tasks that may result in the FPGA card 220 generating significant amounts of heat. In order to protect such specialized FPGA cards from damaging levels of heat, such FPGA cards may be outfitted with up to thirty temperature sensors.

In some scenarios, the volume of temperature readings generated by such large numbers of sensors 220b precludes timely transmission and processing of this data by the remote access controller 255. In such scenarios where closed-loop cooling cannot be supported due to the unfeasibility of processing readings from all of the temperature sensors of an FPGA, the remote access controller 255 may be configured according to various embodiments to identify a subset of temperature sensors that are determined to be critical to maintaining the temperatures of the FPGA card below thresholds that may trigger auxiliary airflow cooling procedures to be initiated, such as reverting to open-loop cooling, or activating additional cooling fans. Temperatures may also be maintained below thresholds that may trigger protection measures such as reducing power and processing speeds in order to reduce the heat being generated.

The FPGA card 220 may also include a management controller 220a that may support interoperation was the remote access controller 255 via a sideband device management bus 275a. As described in additional detail with regard to the below embodiments, the management controller 220a may be configured to interoperate with the remote access controller 255 in identifying and monitoring a subset of the most critical of the sensors 220b supported by the FPGA card 220.

In certain embodiments, IHS 200 may operate using a BIOS (Basic Input/Output System) that may be stored in a non-volatile memory accessible by the processor(s) 205. The BIOS may provide an abstraction layer by which the operating system of the IHS 200 interfaces with the hardware components of the IHS. Upon powering or restarting IHS 200, processor(s) 205 may utilize BIOS instructions to initialize and test hardware components coupled to the IHS, including both components permanently installed as components of the motherboard of IHS 200 and removable components installed within various expansion slots supported by the IHS 200. The BIOS instructions may also load an operating system for use by the IHS 200. In certain embodiments, IHS 200 may utilize Unified Extensible Firmware Interface (UEFI) in addition to or instead of a BIOS. In certain embodiments, the functions provided by a BIOS may be implemented, in full or in part, by the remote access controller 255.

In certain embodiments, remote access controller 255 may operate from a different power plane from the processors 205 and other components of IHS 200, thus allowing the remote access controller 255 to operate, and management tasks to proceed, while the processing cores of IHS 200 are powered off. As described, various functions provided by the BIOS, including launching the operating system of the IHS 200, may be implemented by the remote access controller 255. In some embodiments, the remote access controller 255 may perform various functions to verify the integrity of the IHS 200 and its hardware components prior to initialization of the IHS 200 (i.e., in a bare-metal state).

Remote access controller 255 may include a service processor 255a, or specialized microcontroller, that operates management software that supports remote monitoring and administration of IHS 200. Remote access controller 255 may be installed on the motherboard of IHS 200 or may be coupled to IHS 200 via an expansion slot provided by the motherboard. In support of remote monitoring functions, network adapter 225c may support connections with remote access controller 255 using wired and/or wireless network connections via a variety of network technologies. As a non-limiting example of a remote access controller, the integrated Dell Remote Access Controller (iDRAC) from Dell® is embedded within Dell PowerEdge™ servers and provides functionality that helps information technology (IT) administrators deploy, update, monitor, and maintain servers remotely.

In some embodiments, remote access controller 255 may support monitoring and administration of various managed devices 220, 225, 230, 280 of an IHS via a sideband bus interface. For instance, messages utilized in device management may be transmitted using I2C sideband bus connections 275a-d that may be individually established with each of the respective managed devices 220, 225, 230, 280 through the operation of an I2C multiplexer 255d of the remote access controller. As illustrated, certain of the managed devices of IHS 200, such as FPGA cards 220, network controller 225 and storage controller 230, are coupled to the IHS processor(s) 205 via an in-line bus 215, such as a PCIe root complex, that is separate from the I2C sideband bus connections 275a-d used for device management. The management functions of the remote access controller 255 may utilize information collected by various managed sensors 280 located within the IHS. For instance, temperature data collected by sensors 280 may be utilized by the remote access controller 255 in support of closed-loop airflow cooling of the IHS 200.

In certain embodiments, the service processor 255a of remote access controller 255 may rely on an I2C co-processor 255b to implement sideband I2C communications between the remote access controller 255 and managed components 220, 225, 230, 280 of the IHS. The I2C co-processor 255b may be a specialized co-processor or microcontroller that is configured to interface via a sideband I2C bus interface with the managed hardware components 220, 225, 230, 280 of IHS. In some embodiments, the I2C co-processor 255b may be an integrated component of the service processor 255a, such as a peripheral system-on-chip feature that may be provided by the service processor 255a. Each I2C bus 275a-d is illustrated as single line in FIG. 2. However, each I2C bus 275a-d may be comprised of a clock line and data line that couple the remote access controller 255 to I2C endpoints 220a, 225a, 230a, 280a which may be designated as field replaceable units (FRUs).

As illustrated, the I2C co-processor 255b may interface with the individual managed devices 220, 225, 230, 280 via individual sideband I2C buses 275a-d selected through the operation of an I2C multiplexer 255d. Via switching operations by the I2C multiplexer 255d, a sideband bus connection 275a-d may be established by a direct coupling between the I2C co-processor 255b and an individual managed device 220, 225, 230, 280.

In providing sideband management capabilities, the I2C co-processor 255b may each interoperate with corresponding endpoint I2C controllers 220a, 225a, 230a, 280a that implement the I2C communications of the respective managed devices 220, 225, 230. The endpoint I2C controllers 220a, 225a, 230a, 280a may be implemented as a dedicated microcontroller for communicating sideband I2C messages with the remote access controller 255, or endpoint I2C controllers 220a, 225a, 230a, 280a may be integrated SoC functions of a processor of the respective managed device endpoints 220, 225, 230, 280. In certain embodiments, the endpoint I2C controller 280a of the FPGA card 220 may correspond to the management controller 220a described above.

In various embodiments, an IHS 200 does not include each of the components shown in FIG. 2. In various embodiments, an IHS 200 may include various additional components in addition to those that are shown in FIG. 2. Furthermore, some components that are represented as separate components in FIG. 2 may in certain embodiments instead be integrated with other components. For example, in certain embodiments, all or a portion of the functionality provided by the illustrated components may instead be provided by components integrated into the one or more processor(s) 205 as a systems-on-a-chip.

Figure 3:
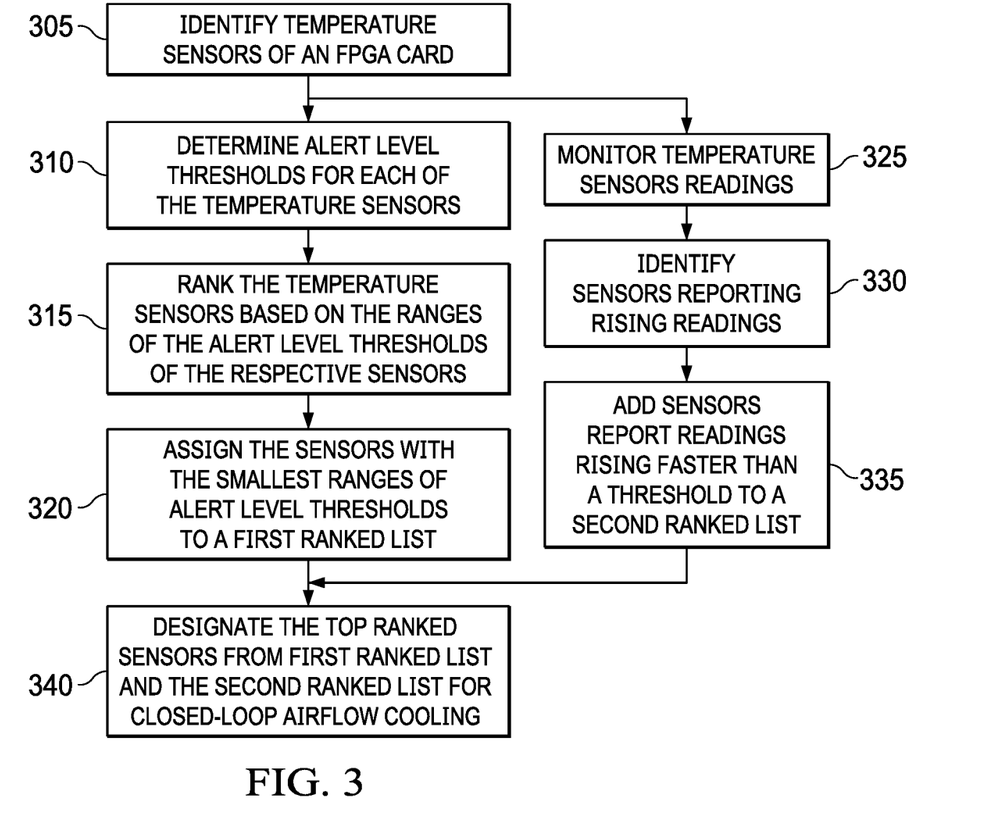
FIG. 3 is a flowchart describing certain steps of a method, according to some embodiments, for identifying critical sensors of an FPGA installed within an IHS.

FIG. 3 is a flowchart describing certain steps of a method, according to some embodiments, for identifying critical sensors of an FPGA installed within an IHS. As described with regard to FIG. 2, an FPGA card may include a relatively large number of temperature sensors that provide temperature readings at various locations on the FPGA card. The illustrated embodiment may begin at block 305 with the identification of the temperature sensors that are provided by the FPGA card. In certain embodiments, the temperature sensors may be identified based on notification messages transmitted by each sensor to the remote access controller upon initialization of the sensors by the FPGA card. In such embodiments, a management controller component of the FPGA card, such as management controller 220a described with regard to FIG. 2, may facilitate transmission of such sensor discovery reports to the remote access controller via a sideband device management bus. In certain embodiments, the remote access controller may query the management controller of the FPGA card for a list of temperature sensors available on the FPGA card.

In order to identify the most critical temperature sensors supported by an FPGA card, at block 310, the alert level thresholds for each of the FPGA card temperature sensors are identified. In certain embodiments, the alert level thresholds may be provided in response to queries issued to the temperature sensors by the management controller of the FPGA card on behalf of the remote access controller. For instance, sensors supporting PLDM (Platform Level Data Model) messaging may be queried for alert level thresholds via queries supported by the PLDM messaging interface. The alert level thresholds may specify a series of escalating temperature thresholds at which the sensors are configured to generate various types of alerts.

In certain embodiments, temperature sensors utilize alert level thresholds that include a warning alert level, a critical alert level and a failure alert level. A warning alert level may specify a temperature threshold at which a sensor may generate a temperature warning message. Such warning alerts may be utilized by the airflow cooling algorithm to increase airflow directed towards the location of the sensor that generated the warning alert. A critical alert level may specify a temperature threshold detected by a temperature sensor at which the remote access controller may revert to open-loop airflow cooling and/or may throttle the processing speed FPGA card in order reduce the heat being generated by the FPGA card. A failure alert level by the temperature sensor may trigger the remote access controller to avoid heat damage to the FPGA by immediately shutting down power to the FPGA card or otherwise placing the FPGA in a low-power state. Other embodiments may utilize various other numbers and types of alert levels.

The thresholds specified for each alert level are used to trigger various types of alert responses based on various ranges of monitored temperature readings. For instance, a temperature sensor may be configured with a warning alert level threshold of 90 degrees Celsius, a critical alert level threshold of 100 degrees Celsius, and a failure alert level threshold of 125 degrees Celsius. If a temperature reading between 90 and 100 degrees Celsius is identified, the temperature sensor generates a warning alert. Likewise, a temperature reading between 100 degrees and 125 degrees results in a critical alert, and a temperature reading above 125 degrees results in a failure alert.

Once such alert level thresholds have been identified for each of the sensors of an FPGA card, at block 315, the sensors are ranked based on the ranges of the alert level thresholds identified for each of the respective sensors. For instance, in the above example, the temperature sensor has a range of 10 degrees between the warning and critical alert level thresholds, and a range of 25 degrees between the critical and failure alert level thresholds. The overall range of the temperature sensor is 35 degrees. Such a sensor may be ranked lower than a temperature sensor with a smaller overall range of alert level thresholds. A smaller range of alert level thresholds for a temperature sensor indicates that smaller changes in monitored temperatures will result in escalation of the alert levels generated by the sensor. A greater range indicates a greater tolerance for increased temperatures before auxiliary cooling procedures will be triggered.

Accordingly, temperature sensors with smaller ranges have a greater sensitivity to changes in temperature, and thus may be considered more critical than sensors with greater ranges, which will accommodate larger changes in detected temperature before escalating an alert condition. In certain embodiments, the ranking of the alert level thresholds from each sensor may give greater weight to the ranges of higher alert levels. For instance, the range of temperatures between the critical and failure alert thresholds may be weighted greater than the temperature range been the critical and warning alert thresholds. Such weightings may be used to place greater emphasis on sensors that are deemed critical due to a having a small range between the critical and failure alert levels, and thus may possible trigger fail-safe cooling measures in response to relatively small increases in detected temperatures.

Based on the ranked ranges of the alert level thresholds, at block 320, a subset of the highest ranked (i.e., the sensors with the smallest ranges of temperature thresholds) sensors may be assigned to a first ranked list. In certain embodiments, no more than a predefined portion of the ranked sensors may be included in the first ranked list. For instance, the remote access controller may be configured to only include the five temperature sensors with the smallest ranges of alert level thresholds. In certain embodiments, the remote access controller may be configured to generate various additional ranked lists to which all of the temperature sensors of the FPGA card may be assigned based on their respective alert level threshold rankings. Each such lists may include temperature sensors with within a band of alert level thresholds ranges, such that each list may represent a tier of criticalness of the sensors listed therein. In certain embodiments, the management controller of the FPGA card may be configured to poll temperature sensors included in higher ranked lists more frequently than temperatures in lower ranked lists.

In order to guard against rising temperatures being reported by sensors that have not been designated as critical based on the sensor rankings, the management controller of an FPGA card may be configured to monitor temperature readings reported by all of the temperature sensors of an FPGA card. Based on such monitoring and a history of recent readings maintained for each sensor, the management controller of the FPGA card may identify temperature sensors whose temperature readings indicate rising temperatures that warrant closer monitoring and potential inclusion in the list of critical sensors of an FPGA card. At block 325, the remote access controller may rely on the management controller of the FPGA card to monitor the readings generated by the temperature sensors. By relying on the management controller of the FPGA card for this temperature screening, the temperature readings from the sensors do not need to be transmitted to the remote access controller and are instead processed locally by the management controller of the FPGA.

At block 330, the temperature sensors reporting readings that are rising faster than a threshold value may be identified. For instance, any temperature sensor reporting an increase in reported temperatures greater than 5° C. during a five second interval may indicate an imminent triggering of an alert level threshold by the temperature sensor. If such rapidly rising temperature sensor readings are identified, at block 335, the temperature sensors reporting such rising readings may be assigned to a second ranked list, where the temperature sensors are ranked in the second list based on the observed rate of change of the monitored temperature readings. Additionally or alternatively, the monitored temperature sensors may be ranked between according to the expected time until the sensor triggers a threshold level alert based on the detected rate of increase in the monitored temperature readings.

At block 340, the top ranked sensors from the first ranked list and the second ranked list may be merged into a new list listing of sensors, where the new merged listing of sensors indicates the most critical sensors that may be of best use in supporting closed-loop cooling by the airflow cooling algorithm of the IHS and/or chassis. In certain embodiments, only predefined portions of the sensors in the first ranked list and in the second ranked list may be included in the merged list. For instance, the first ranked list may be limited to contributing no more than the five sensors with the smallest ranges of alert level thresholds in the merged list. Similarly, only the five top-ranked sensors from the second ranked list (e.g., the fastest rising and/or nearest to an alert level threshold) may be included in the merged list. By including sensors from the second list in the merged list, any temperature sensors reporting potentially damaging temperature readings are included in the merged list, thus ensuring that sensor readings indicating potential damage are properly addressed, regardless of whether the sensor has been included in the list of critical sensors based on alert level thresholds.

In certain embodiments, the management controller of the FPGA card may be configured to forward sensor readings to the remote access controller, but only from sensors that have designated as critical. Temperature readings from non-critical sensors may be monitored by the management controller as described in order to identify any sensors reporting rapidly rising temperatures. In this manner, the amount of temperature sensor data being relayed on the sideband management bus is reduced. In addition, the amount of sensors that may be designated as critical may be configured in order to avoid overwhelming the airflow cooling algorithms, but still including as many temperature sensors as possible in the closed-loop airflow cooling.

It should be understood that various operations described herein may be implemented in software executed by logic or processing circuitry, hardware, or a combination thereof. The order in which each operation of a given method is performed may be changed, and various operations may be added, reordered, combined, omitted, modified, etc. It is intended that the invention(s) described herein embrace all such modifications and changes and, accordingly, the above description should be regarded in an illustrative rather than a restrictive sense.

Although the invention(s) is/are described herein with reference to specific embodiments, various modifications and changes can be made without departing from the scope of the present invention(s), as set forth in the claims below. Accordingly, the specification and figures are to be regarded in an illustrative rather than a restrictive sense, and all such modifications are intended to be included within the scope of the present invention(s). Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements. The terms "coupled" or "operably coupled" are defined as connected, although not necessarily directly, and not necessarily mechanically. The terms "a" and "an" are defined as one or more unless stated otherwise. The terms "comprise" (and any form of comprise, such as "comprises" and "comprising"), "have" (and any form of have, such as "has" and "having"), "include" (and any form of include, such as "includes" and "including") and "contain" (and any form of contain, such as "contains" and "containing") are open-ended linking verbs. As a result, a system, device, or apparatus that "comprises," "has," "includes" or "contains" one or more elements possesses those one or more elements but is not limited to possessing only those one or more elements. Similarly, a method or process that "comprises," "has," "includes" or "contains" one or more operations possesses those one or more operations but is not limited to possessing only those one or more operations.

The invention claimed is:

1. A method for identifying critical sensors of a device installed within an IHS (Information Handling System), the method comprising:
    identifying a plurality of temperature sensors provided by the device;
    determining alert level thresholds for each of the plurality of temperature sensors;
    ranking the temperature sensors based on ranges of the alert level thresholds of the respective temperature sensors;
    assigning a first portion of the temperature sensors with the smallest ranges of alert level thresholds to a first ranked list;
    monitoring temperature sensor readings generated by each of the plurality of temperature sensors;
    assigning temperature sensors indicating temperature sensor readings rising faster than a first threshold to a second ranked list; and
    designating a portion of the temperature sensors in the first ranked list and a portion of the temperature sensors in the second ranked list for use by an airflow cooling system of the IHS, wherein the airflow cooling system utilizes the designated temperature sensors to provide closed-loop airflow cooling of the IHS.

2. The method of claim 1, wherein the alert level thresholds specify temperature thresholds for alert levels comprising a warning level, a critical level and a failure level.

3. The method of claim 2, wherein the range of the alert level thresholds of a temperature sensor comprises the difference between the warning level temperature threshold and the failure level temperature threshold.

4. The method of claim 1, wherein the sensor readings of the plurality of temperature sensors are monitored by a management controller of the device.

5. The method of claim 4, wherein a management controller transmits temperature readings to the remote management controller only for the sensors designated for use by the airflow cooling system.

6. The method of claim 1, wherein the device is an FPGA (Field Programmable Gate Array) card.

7. A system for identifying critical sensors of device installed within an IHS (Information Handling System), the system comprising:
 a remote access controller configured to monitor operations of the IHS, the remote access controller configured to:
  identify a plurality of temperature sensors provided by the device;
  determine alert level thresholds for each of the plurality of temperature sensors;
  rank the temperature sensors based on the ranges of the alert level thresholds of the respective temperature sensors;
  assign a first portion of the temperature sensors with the smallest ranges of alert level thresholds to a first ranked list;
  monitor temperature sensor readings generated by each of the plurality of temperature sensors;
  assign temperature sensors indicating temperature sensor readings rising faster than a first threshold to a second ranked list; and
  designate a portion of the temperature sensors in the first ranked list and a portion of the temperature sensors in the second ranked list for use by an airflow cooling system of the IHS, wherein the airflow cooling system utilizes the designated temperature sensors to provide closed-loop airflow cooling of the IHS; and
 a management controller of the device configured to:
  forward temperature readings generated by the designated portion of temperature sensors to the remote access controller.

8. The system of claim 7, wherein the alert level thresholds specify temperature thresholds for alert levels comprising a warning level, a critical level and a failure level.

9. The system of claim 8, wherein the range of the alert level thresholds of a temperature sensor comprises the difference between the warning level temperature threshold and the failure level temperature threshold.

10. The system of claim 7, wherein the temperature sensor readings of the plurality of temperature sensors are monitored by the management controller and only the readings for the designated portion of the temperature sensors are transmitted to the remote access controller.

11. The system of claim 7, wherein the device is an FPGA (Field Programmable Gate Array) card.

12. A remote access controller configured for identifying critical sensors of device installed within an IHS (Information Handling System), the remote access controller comprising:
 one or more processors; and
 a memory device coupled to the one or more processors, the memory device storing computer-readable instructions that, upon execution by the one or more processors, cause the remote access controller to:
  identify a plurality of temperature sensors provided by the device;
  determine alert level thresholds for each of the plurality of temperature sensors;
  rank the temperature sensors based on the ranges of the alert level thresholds of the respective temperature sensors;
  assign a first portion of the temperature sensors with the smallest ranges of alert level thresholds to a first ranked list;
  monitor temperature sensor readings generated by each of the plurality of temperature sensors;
  assign temperature sensors indicating temperature sensor readings rising faster than a first threshold to a second ranked list; and
  designate a portion of the temperature sensors in the first ranked list and a portion of the temperature sensors in the second ranked list for use by an airflow cooling system of the IHS, wherein the airflow cooling system utilizes the designated temperature sensors to provide closed-loop airflow cooling of the IHS.

13. The remote access controller of claim 12, wherein the alert level thresholds specify temperature thresholds for alert levels comprising a warning level, a critical level and a failure level.

14. The remote access controller of claim 13, wherein the range of the alert level thresholds of a temperature sensor comprises the difference between the warning level temperature threshold and the failure level temperature threshold.

15. The remote access controller of claim 12, wherein the temperature sensor readings of the plurality of temperature sensors are monitored by a management controller of the device.

16. The remote access controller of claim 15, wherein the management controller transmits temperature readings to the remote management controller only for the sensors designated for use by the airflow cooling system.

17. The remote access controller of claim 12, wherein the device is an FPGA (Field Programmable Gate Array) card.

* * * * *